United States Patent
Heffner et al.

(10) Patent No.: US 7,344,760 B1
(45) Date of Patent: Mar. 18, 2008

(54) WEAR-RESISTANT ELECTRICALLY CONDUCTIVE BODY

(75) Inventors: Kenneth H. Heffner, Largo, FL (US); Charles W. Reed, Blacksburg, VA (US); David M. File, Lyons, IN (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/662,162

(22) Filed: Sep. 12, 2003

(51) Int. Cl.
*C23C 14/48* (2006.01)

(52) U.S. Cl. .................. 427/523; 427/524; 427/249.7; 204/192.1

(58) Field of Classification Search ................ 310/128; 428/408; 427/249.7, 523, 524; 204/192.1
See application file for complete search history.

(56) References Cited

U.S. PATENT DOCUMENTS

| | | | | |
|---|---|---|---|---|
| 4,844,785 A * | 7/1989 | Kitabatake et al. | .... | 204/192.11 |
| 4,889,494 A * | 12/1989 | Kunz | .......................... | 439/13 |
| 4,992,298 A * | 2/1991 | Deutchman et al. | ........ | 427/524 |
| 5,374,318 A * | 12/1994 | Rabalais et al. | ............ | 428/469 |
| 5,635,245 A * | 6/1997 | Kimock et al. | ............ | 427/249.7 |
| 5,786,068 A * | 7/1998 | Dorfman et al. | ............ | 428/408 |
| 6,086,962 A | 7/2000 | Mahoney et al. | ............ | 427/577 |
| 6,147,809 A | 11/2000 | Corbasson et al. | ......... | 359/642 |
| 6,533,916 B1* | 3/2003 | Puetter et al. | ............... | 205/188 |
| 6,838,627 B1* | 1/2005 | Isberg et al. | ................ | 200/262 |
| 6,884,290 B2* | 4/2005 | Swain et al. | .................. | 117/68 |
| 7,285,479 B2* | 10/2007 | Tachibana et al. | .......... | 438/460 |
| 2006/0124349 A1* | 6/2006 | Fujimora et al. | ........... | 174/256 |

FOREIGN PATENT DOCUMENTS

| | | | |
|---|---|---|---|
| EP | 1174885 | * | 1/2002 |
| JP | 06-275174 | * | 9/1994 |

OTHER PUBLICATIONS

Kinoshita, Haruhisa, et al., "Electrical conductive hard-carbon (diamond-like carbon) films formed by i-C4H10/N2 supermagnetron plasma chemical vapor deposition method". Thin Solid Films, vol. 373, Issues 1-2, Sep. 3, 2000, pp. 251-254.*
Takeno, Takanori, et al., "Electrically conductive properties of tungsten-containing diamond-like carbon films". Diamond and Related Materials, vol. 15, Issues 11-12, Nov.-Dec. 2006, pp. 1902-1905.*
Miyagawa, Soji, et al. "Electrically Conductive Diamond-Like Carbon Coatings Prepared by Plasma-Based Ion Implantation with Bipolar Pulses". New Diamond Front Carbon Technology (2006). (Bib Data Only).*

* cited by examiner

*Primary Examiner*—Bret Chen
(74) *Attorney, Agent, or Firm*—John Tarlano

(57) ABSTRACT

A method for making a wear-resistant electrically conductive body having an electrically conductive diamond-like carbon coating, by ion-accelerating copper ions from a copper ion source onto a negatively charged electrically conductive body, and simultaneously ion-accelerating diamond-like carbon ions from a separate carbon ion source onto the negatively charged electrically conductive body. Also a dual ion-beam process for depositing a wear-resistant diamond-like carbon coating on a negatively charged electrically conductive surface by using an ion-beam to stabilize ionized carbon atoms that have been ion-accelerated onto the negatively charged electrically conductive surface.

2 Claims, 3 Drawing Sheets

WEAR-RESISTANT ELECTRICALLY CONDUCTIVE BODY

BACKGROUND OF THE INVENTION

In the past, an outer surface of an electrically conductive body has been covered with an electrochemically applied metal, a mechanically applied metal foil, or mechanically applied metal cap, in order to make the electrically conductive body wear resistant. Such combinations are taught in U.S. Pat. Nos. 4,104,109 and 5,161,667.

The present invention relates to a wear resistant electrically conductive body. The outer surface of the electrically conductive body has an ion-accelerated, wear-resistant, electrically conductive diamond-like carbon coating. The outer surface of the electrically conductive body is formed by the electrically conductive diamond-like carbon coating.

The present invention relates to a method for forming the ion-accelerated, wear-resistant, electrically conductive diamond-like carbon coating on the electrically conductive body. The resultant outer surface of the electrically conductive body is an ion-formed diamond-like surface The electrically conductive diamond-like carbon coating is a combination of amorphous diamond-like carbon material and electrically conductive metal material. The conductivity of the outer surface will benefit from graphitic characteristics of the amorphous diamond-like carbon material. That is, the higher the percentage of graphite in the amorphous diamond-like carbon material, the greater the conductivity of the diamond-like carbon coating. However, the percentage of graphite in the amorphous diamond-like carbon material must be controlled, in order to avoid excessive graphitic characteristics.

An ion beam process, such as a dual ion beam process, is used to form the coating. A dual ion beam process is used to coat an electrically conductive body with the electrically conductive diamond-like carbon coating.

The graphite component of the electrically conductive diamond-like carbon coating can be controlled, percentage-wise, by adjusting conditions of the coating process By adjusting a carbon ion beam intensity of carbon ions that are being applied to the electrically conductive body, applied carbon atoms are held in an intermediate reactive state. The carbon atoms will stabilize, by oxidation, into a resonance-stabilized, covalent structure of an aromatic graphite structure.

The outer surface of an electrically conductive body, such as a copper slip ring, is covered by an ion-accelerated, wear-resistant, electrically conductive coating that contains diamond-like carbon atoms and electrically conductive metal atoms. A wear-resistant electrically conductive body is produced. The produced wear-resistant electrically conductive body is a combination of an electrically conductive body and an ion-accelerated, wear-resistant, electrically conductive coating. Ion-accelerated diamond-like carbon atoms and ion-accelerated metal atoms form the ion-accelerated, wear-resistant, electrically conductive coating. The ion-accelerated, wear-resistant, electrically conductive coating covers an outer surface of the wear-resistant electrically conductive body. The coating causes the wear resistant electrically conductive body to be both electrically conductive and wear resistant.

The ion-accelerated metal atoms of the disclosed ion-accelerated, wear-resistant, electrically conductive coating form contiguous conductive chains of metal atoms. The ion-accelerated, wear-resistant, electrically conductive coating contains contiguous metal atoms, such as contiguous copper atoms. The contiguous metal atoms cause the ion-accelerated wear-resistant conductive coating to be electrically conductive from one side of the coating to the other side of the coating.

The ion-accelerated, wear-resistant, electrically conductive coating of the disclosed wear-resistant conductive body contains ion-accelerated diamond-like carbon atoms. The ion-accelerated diamond-like carbon atoms cause the wear-resistant conductive coating to be wear resistant.

The ion accelerated, wear-resistant, electrically conductive coating is formed by simultaneously ion-accelerating both metal ions, such as copper ions, and diamond-like carbon ions onto the outer surface of an electrically conductive body, such as an ordinary motor slip ring. The copper ions and diamond-like carbon ions are electrically attracted to the electrically conductive body within an ion accelerator.

An ion sprayer is shown in U.S. Pat. No. 6,086,962. U.S. Pat. No. 6,086,962 discloses a method of spraying diamond-like carbon ions and non-conductive silicon ions onto an electrically nonconductive surface. The teachings of U.S. Pat. No. 6,086,962 are incorporated herein by reference.

In the method of the present invention, metal ions, such as copper ions, and diamond-like carbon ions are simultaneously ion-accelerated onto an outer surface of an electrically conductive body, such as an ordinary motor slip ring. A negative voltage is applied to the conductive body. The negative voltage causes the ions to accelerate toward the conductive body.

In the '962 patent, silicon ions and diamond-like carbon ions are sprayed onto an electrically nonconductive body, as the ions accelerate toward cathode. The '962 patent does not suggest simultaneously ion-accelerating metal ions and diamond like carbon ions toward an electrically conductive body, in order to form an wear-resistant electrically conductive coating on the electrically conductive body.

By the method of the present invention, copper ions and diamond-like carbon ions are accelerated onto an electrically conductive body. Copper ions from the ion accelerator are attracted to the electrically conductive body by electrons that are on the electrically conductive body. As the copper ions impinge the electrically conductive body, the copper ions are electrically neutralized by electrons that are located on the electrically conductive body. Copper atoms, that is, neutralized copper ions, are formed on the electrically conductive body. These copper atoms then conduct other electrons from the electrically conductive body. These other electrons attract copper ions toward the copper atoms. A chains of copper atoms is formed. Chains of copper atoms are built up on the electrically conductive body.

The advantages of using an ion-accelerated, wear-resistant conductive coating on a conductive body are enhancement of wear resistance, reduction of contact friction, preservation of surface contact conductivity and preservation of surface finish.

SUMMARY OF THE INVENTION

A wear-resistant electrically conductive body comprising an electrically conductive body; and an ion-accelerated, wear-resistant, electrically conductive coating on a surface of the electrically conductive body, the ion-accelerated, wear-resistant, electrically conductive coating containing contiguous electrically conductive metal atoms and diamond-like carbon atoms.

DESCRIPTION OF THE PREFERRED EMBODIMENT

Figure 1A:
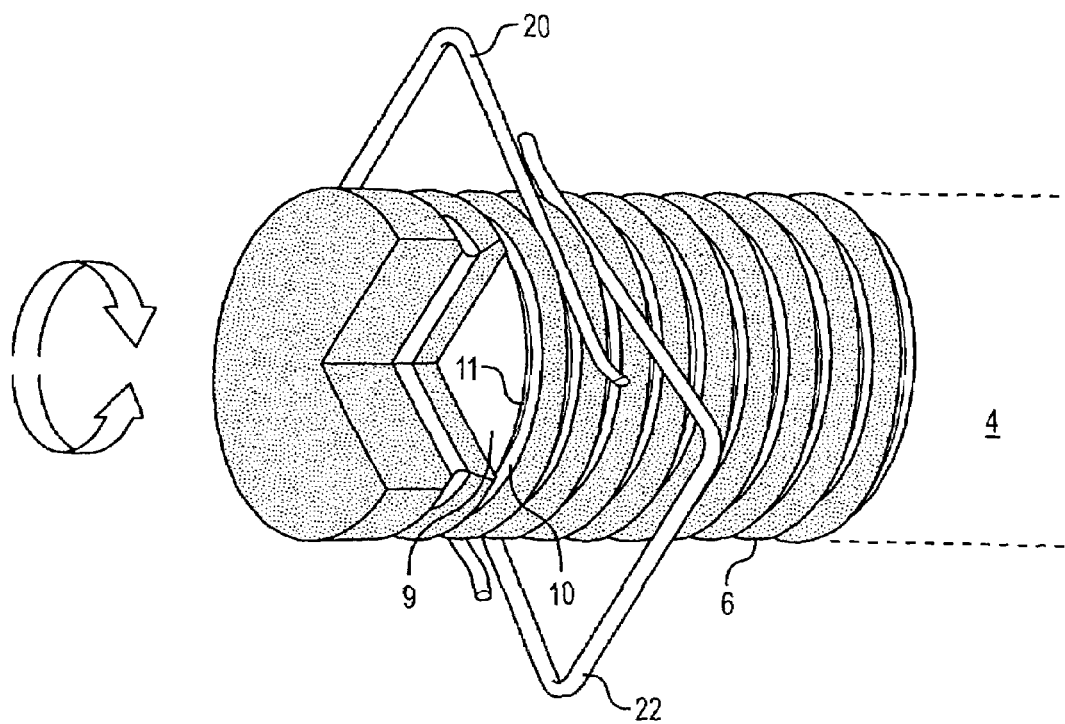
FIG. 1A is a perspective view of a slip ring assembly.

FIG. 1A shows an assembly 4. Assembly 4 has a rotor 6. Rotor 6 has copper slip rings, including copper slip ring 9. A copper and diamond-like carbon coating 10 is shown as having been ion-accelerated onto an outer electrically conductive surface 11 of the copper slip ring 9.

As shown in FIG. 1A, an ion-accelerated, wear resistant, electrically conductive coating 10 is formed on the outer surface 11 of copper slip ring 9. Coating 10 is a layer of electrically conductive, wear-resistant material. The coating 10 has sufficient electrical conductivity to transmit an electrical current from a power source through a brush, shown as 18 in FIG. 1B, to copper slip ring 9. Brush 18 is similar to brushes 20 and 22.

Figure 1B:
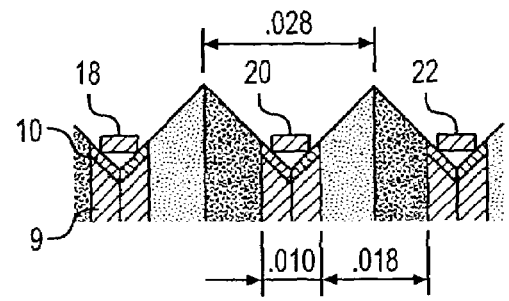
FIG. 1B is a view of a section of the slip ring assembly taken through the longitude axis of a slip ring assembly.

Brushes 18, 20 and 22 are partially shown in FIG. 1B. Brush 18 is similar to brushes 20 and 22 shown in FIGS. 1A and 1B. An ion-accelerated, wear resistant, electrically conductive coating is also ion-accelerated onto the outer surface of each of brushes 18, 20 and 22.

Figure 2:
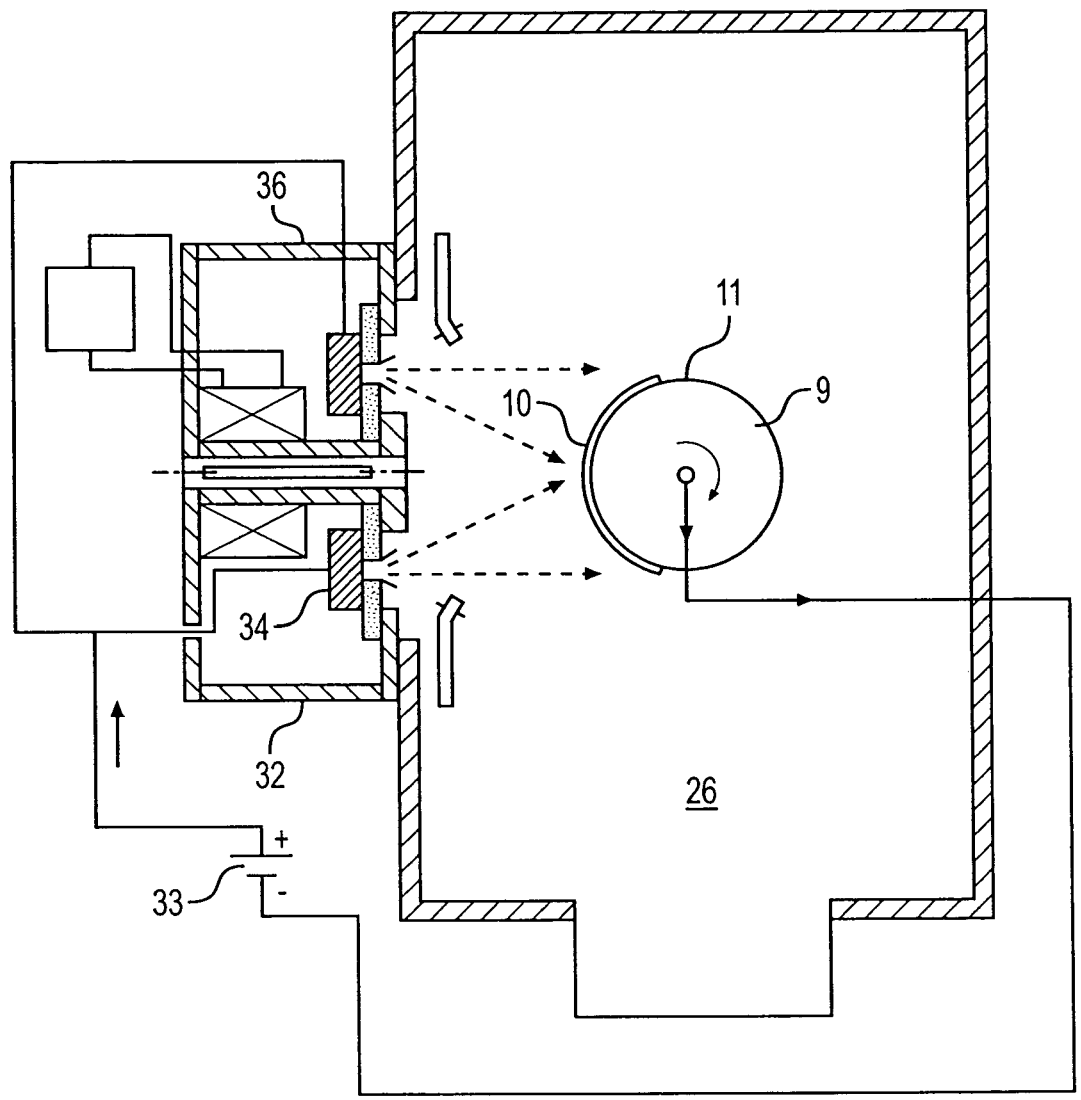
FIG. 2 is a view of a section of an ion accelerator, plus a schematic view of associated electrical equipment.

An ion accelerator 26 and associated electrical equipment are shown in FIG. 2. A diamond-like carbon ion source 32 generates diamond-like carbon ions. A power source 33 is connected between an anode 34 and slip ring 9. Positively charged carbon ions are electrically accelerated toward the surface 11 of copper slip ring 9. The diamond-like carbon ion source 32 can use methane gas.

A copper ion source 36 is shown in FIG. 2. The copper ion source 36 simultaneously generates copper ions. The copper ions are electrically accelerated toward the surface 11 of slip ring 9. The copper ion source 36 can used in conjunction with vaporized aqueous copper sulfate. The aqueous copper sulfate is vaporized, by heating the aqueous copper sulfate. Copper from the copper sulfate is ionized by copper ion source 36.

An ion-accelerated, wear resistant electrically conductive coating 10 is gradually formed on surface 11 of slip ring 9, as shown in FIG. 2. The ion-accelerated, wear resistant, electrically conductive coating 10 is increased in thickness due to a build up of diamond-like carbon atoms and the copper atoms on surface 11. The slip ring 9 is rotated during the ion-accelerating process, to coat the complete outer surface 11 of slip ring 9.

Figure 3:
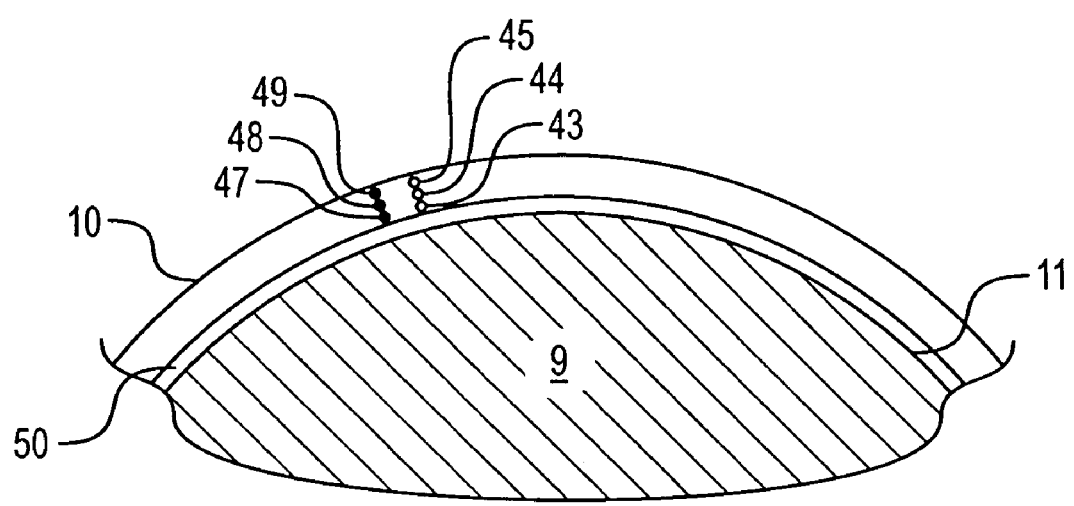
FIG. 3 is a sectional of a slip ring, the section taken perpendicularly through the rotational axis of a slip ring.

Diamond-like carbon atoms 43, 44 and 45 and the copper atoms 47, 48 and 49 are shown in FIG. 3. These atoms are part of the ion-accelerated, wear resistant electrically conductive coating 10 that is on the surface 11 of slip ring 9. The copper atoms 47, 48 and 49 are in a coating 10. Coating 10 has a concentration of 30 percent copper, by atomic weight. Copper atoms can be made to preferably produce a coating 10 that has a concentration of 0.1 percent to 40 percent of copper atoms, by atomic weight. However a coating 10 could have a concentration of 0.1 percent to 99.9 percent of copper atoms, by atomic weight.

The copper atoms 47, 48 and 49, shown in FIG. 3, are part of electronically a conductive chain of conductive copper atoms. Chains of copper atoms extend through the width of coating 10. Coating 10 is made electrically conductive by such chains of copper atoms. The copper atoms form a chain of contiguous electrically conductive atoms. The chain of contiguous electrically conductive atoms can pass an electrical current through the thickness of coating 10.

An interfacial layer 50 is also shown in FIG. 3. The interfacial layer 50 is applied to the surface 11 of slip ring 9 prior to ion accelerating ions, for coating 10, onto slip ring 9. An interfacial layer 50 promotes adhesion of coating 10 to slip ring 9. The interfacial layer 50 could be gold. An evaporation chamber could be used to evaporate the interfacial layer 50 onto slip ring 9.

Other metal ions, instead of copper ions, could be ion accelerated onto slip ring 9. Such other ions are gold ions, molybedenum ions, silver ions, palladium ions, platinum ions or a combination of nickel ions and palladium ions.

A method can be used for forming a wear-resistant diamond-like coating on an electrically conductive body. Two ion beams are used to deposit the wear resistant diamond like coating. A first ion beam is used to sputter a surface of a diamond-like carbon source. A second ion beam is used to retain carbon atoms, that have been sputtered on the electrically conductive body, in a metastable state. The metastable carbon atoms are free radicals, radical ions, etc. The power and intensity of the first ion beam can be adjusted to control the intensity of energy applied to the diamond-like carbon source. The power and intensity of the second ion beam can be adjusted to control the characteristics of the applied diamond-like coating While the present invention has been disclosed in connection with the preferred embodiment thereof, it should be understood that there may be other embodiments which fall within the spirit and scope of the invention as defined by the following claims.

What is claimed is:

1. A method for making a wear-resistant electrically conductive body, comprising ion-accelerating copper ions and diamond-like carbon ions onto an electrically conductive body, the ion-accelerating of the copper ions and diamond-like carbon ions occurring simultaneously.

2. A dual ion-beam process for depositing a wear-resistant diamond-like coating on an electrically conductive surface, comprising (a) sputtering a surface of a diamond-like carbon source with first ion beam;

(b) striking carbon atoms that are on the electrically conductive surface with a second ion beam, in order to maintain the carbon atoms in a metastable state;

(c) adjusting power and intensity of the first ion beam in order to control an intensity of energy applied to the diamond-like carbon source; and (d) adjusting power and intensity of the second ion beam, in order to control characteristics of a wear-resistant diamond-like coating on the electrically conductive surface.

* * * * *